(12) United States Patent
Lin

(10) Patent No.: US 11,469,189 B2
(45) Date of Patent: Oct. 11, 2022

(54) INDUCTOR AND TRANSMISSION LINE WITH AIR GAP

(71) Applicant: Intel Corporation, Santa Clara, CA (US)

(72) Inventor: Kevin Lin, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 944 days.

(21) Appl. No.: 16/024,675

(22) Filed: Jun. 29, 2018

(65) Prior Publication Data

US 2020/0006261 A1 Jan. 2, 2020

(51) Int. Cl.
| | |
|---|---|
| H01L 23/66 | (2006.01) |
| H01L 23/528 | (2006.01) |
| H01L 23/532 | (2006.01) |
| H01L 23/522 | (2006.01) |
| H01L 21/768 | (2006.01) |
| H01L 21/311 | (2006.01) |
| H01L 49/02 | (2006.01) |

(52) U.S. Cl.
CPC ........ *H01L 23/66* (2013.01); *H01L 21/31111* (2013.01); *H01L 21/7682* (2013.01); *H01L 21/76802* (2013.01); *H01L 21/76834* (2013.01); *H01L 21/76877* (2013.01); *H01L 23/5227* (2013.01); *H01L 23/5283* (2013.01); *H01L 23/5329* (2013.01); *H01L 28/10* (2013.01); *H01L 2223/6627* (2013.01); *H01L 2223/6661* (2013.01)

(58) Field of Classification Search
CPC .............. H01L 23/66; H01L 21/31111; H01L 21/76802; H01L 21/7682; H01L 21/76834; H01L 21/76877; H01L 23/5227; H01L 23/5283; H01L 23/5329; H01L 28/10; H01L 2223/6627; H01L 2223/6661; H01L 23/60; H01L 25/16; H01L 23/5222; H01L 23/5225; H01L 23/645
See application file for complete search history.

(56) References Cited

U.S. PATENT DOCUMENTS

| | | | | |
|---|---|---|---|---|
| 2005/0067673 | A1* | 3/2005 | Geffken | H01L 21/7682 257/573 |
| 2009/0309230 | A1* | 12/2009 | Cui | H01L 21/76832 257/773 |
| 2018/0025974 | A1* | 1/2018 | Basker | H01L 21/7682 257/534 |
| 2019/0108942 | A1* | 4/2019 | Singh | H01F 5/003 |

* cited by examiner

*Primary Examiner* — Thanh T Nguyen
(74) *Attorney, Agent, or Firm* — Schwabe, Williamson & Wyatt, P.C.

(57) ABSTRACT

An integrated circuit structure comprises one or more sets of first and second conductive lines along a same direction in an interlayer dielectric (ILD), the first and second conductive lines having a width greater than 2 μm. An air gap is in the ILD between the first and second conductive lines, the air gap extending across the ILD to sidewalls of the first and second conductive lines.

12 Claims, 8 Drawing Sheets

INDUCTOR AND TRANSMISSION LINE WITH AIR GAP

TECHNICAL FIELD

Embodiments of the disclosure are in the field of integrated circuit structures and, in particular, inductor and transmission line with air gap.

BACKGROUND

High performance and small form-factor passive devices such as capacitors, inductors, and resistors, and even transmission lines are of increasing importance in integrated circuit (IC) chip packages. For a transmission line, the characteristic impedance is determined by capacitance between adjacent lines. To mitigate impedance, a larger space between the transmission lines is desired than what is permitted by design rules. For inductors of the planar, multi-turn configuration, the self-resonance frequency (SRF) of the inductor can limit the performance of the inductor and an electronic device it is coupled to based on parasitic capacitance between coils. Quality Factor, Q, is the commonly accepted indicator of inductor performance in an IC. Q is a measure of the relationship between power loss and energy storage in an inductor. For example, a multi-turn or spiral inductor typically experiences losses due to coupling, cross talk noise, resistance, and parasitic capacitance between coils, among others. Consequently, a reduced inductance and lowering of Q values occurs.

One attempt at mitigating parasitic capacitance has been to design inductors to have only one coil. However, this comes with an area penalty, just as spacing transmission lines far apart comes with an area penalty.

DESCRIPTION OF THE EMBODIMENTS

Figure 1A:
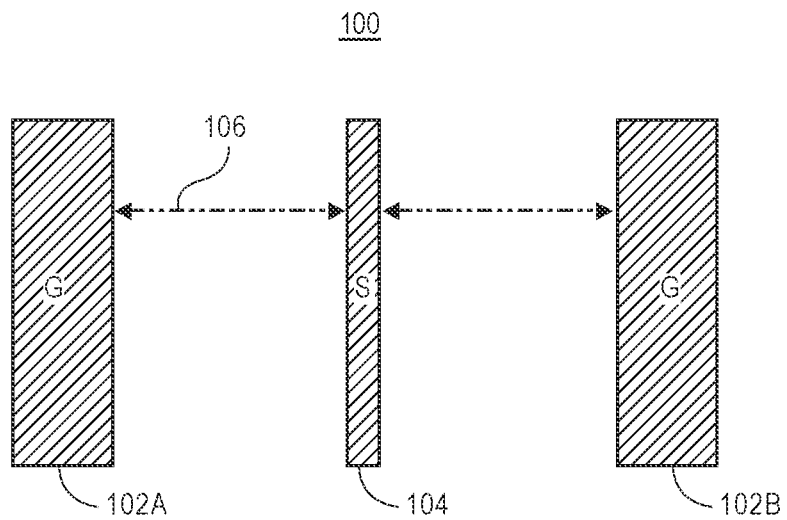
FIG. 1A shows a large conductive structure, which in the example embodiment comprises transmissions lines.

Inductor and transmission line with air gap are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to isolation architectures for large conductive structures that are on the order of a few microns in size. Embodiments may include or pertain to methods for scaling up air gap technology from use with 14 nanometer feature sizes to use with large conductive structures such as transmission lines and multi-turn inductors. One or more embodiments may be implemented to realize increased performance for such large conductive structures due to the use of air gap isolation that reduces parasitic capacitance between adjacent conductive lines.

Figure 1B:
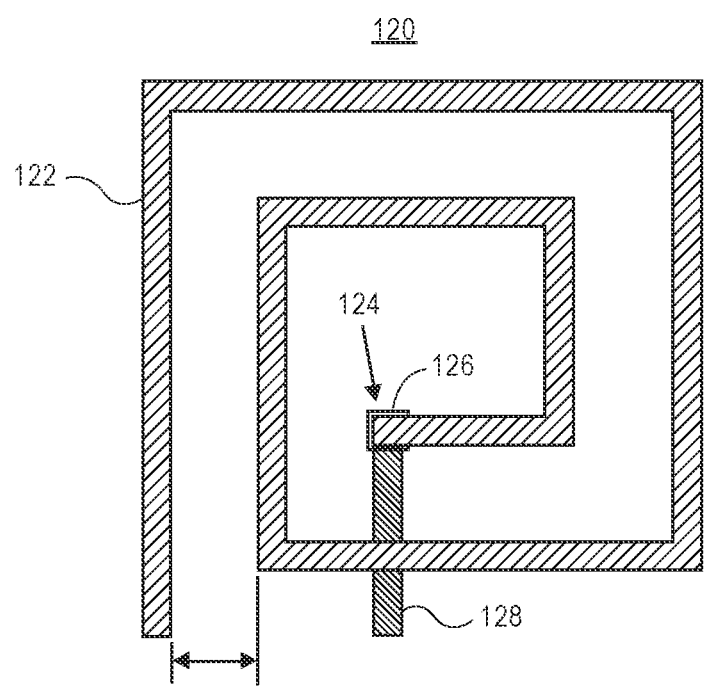
FIG. 1B shows another large conductive structure, which in one example embodiment comprises a planar, multi-turn or spiral inductor.

To provide context, FIGS. 1A and 1B illustrate plan views of large conductive structures. FIG. 1A shows a large conductive structure, which in the example embodiment shown comprises transmissions lines 100. The transmission lines 100 may include parallel ground lines 102A and 102B with a signal line 104 in between. The impedance of the transmission lines 100 is determined by capacitance between adjacent lines. To mitigate impedance, one approach would be to separate adjacent transmission lines by a larger distance 106 than permitted by design rules. However, spacing the transmission lines far apart comes with an area penalty.

FIG. 1B shows another large conductive structure, which in one example embodiment comprises a planar, multi-turn inductor 120 (also referred to as a spiral inductor). The multi-turn inductor 120 comprises a plurality of conductive line segments 122 arranged generally in the shape of increasingly smaller square or turns having an open center. A terminal 124 is also designated at a location of a via 126 for pinning out the terminal 124 to another conductive line referred to as a trace 128. The plurality of conductive line segments 122 may alternatively be arranged as increasingly smaller spirals or coils. Regardless of shape, the self-resonance frequency (SRF) of the multi-turn inductor 120 can limit the performance of the multi-turn inductor 120 and any electronic device the multi-turn inductor 120 is coupled due to parasitic capacitance between the conductive line segments 122. One attempt at mitigating parasitic capacitance has been to design inductors to have only one turn or coil, or otherwise separating the conductive line segments 122 as far as possible.

In accordance with one or more embodiments described herein, one or more conductive structures are disclosed that have improved isolation techniques to reduce parasitic capacitance between adjacent conductive lines. More particularly, an air gap structure is scaled up for use with large conductive structures that are on the scale of microns in size. One or more embodiments provide spacers on opposite ends of an open end of the air gaps that effectively closes the gap between the ends so that a dielectric layer may bridge the gap during a subsequent deposition. The air gaps effectively reduce parasitic capacitance of large conductive structures such as transmission lines and multi-turn inductors and enables the structures to be fabricated with less distance between adjacent conductive lines. A large conductive structure fabricated using such an architecture may exhibit an increase in device performance.

Figure 2A:
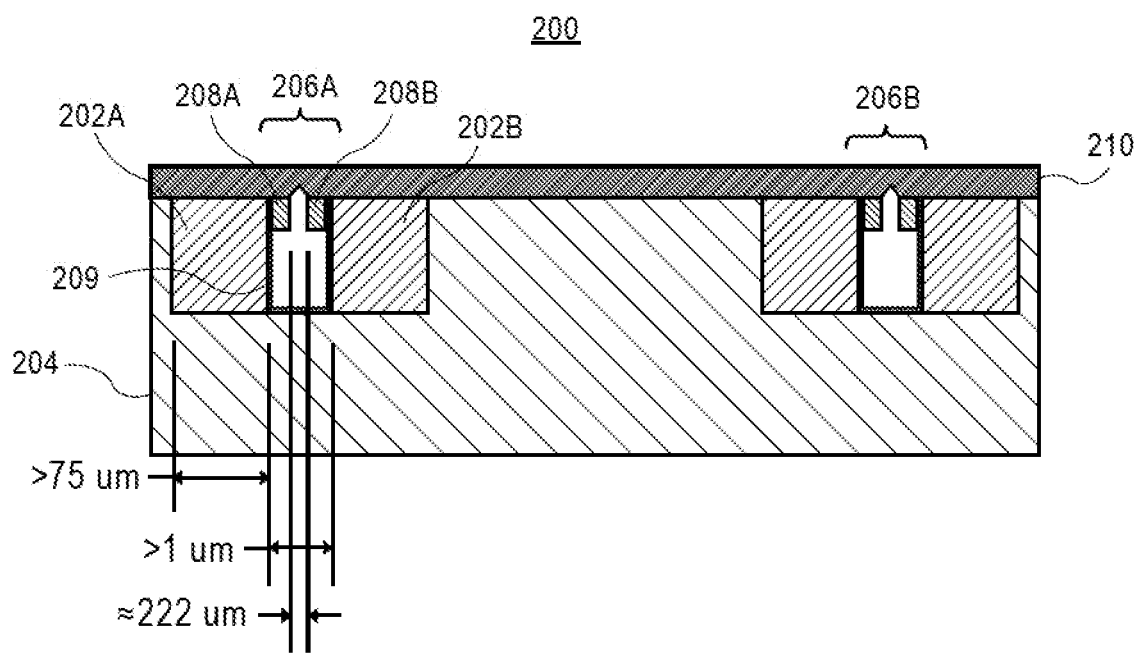
FIG. 2A is a side cross-sectional view (through the section line A-A of FIG. 2B) of a portion of an IC structure of a first conductive structure having adjacent conductive lines separated by air gaps.
Figure 2B:
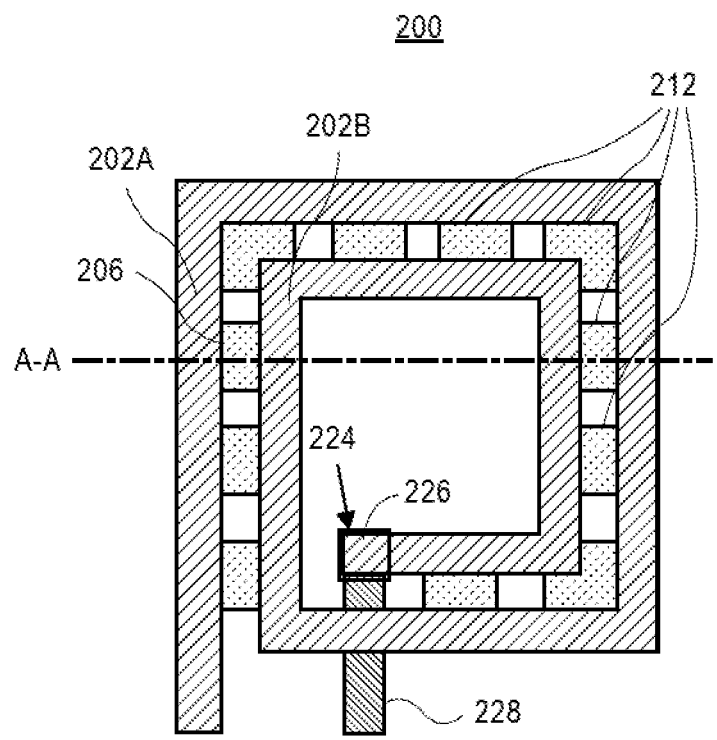
FIG. 2B is a plan view of the first conductive structure showing an example embodiment where the first conductive structure comprises a multi-turn inductor.

FIG. 2A is a side cross-sectional view (through the section line A-A of FIG. 2B) of a portion of an IC structure of a conductive structure 200 having adjacent conductive lines separated by air gaps. FIG. 2B is a plan view of the conductive structure 200 showing an example embodiment where the conductive structure 200 comprises a multi-turn inductor.

The conductive structure 200 comprises one or more sets of first and second conductive lines 202A and 202B along a same direction in an interlayer dielectric (ILD) 204. The conductive lines, including the first and second conductive lines 202A and 202B, are arranged generally in the shape of increasingly smaller square or turns having an open center. For example first conductive line 202A may comprise an outer turn of the multi-turn inductor, while second conductive line 202B may comprise an inner turn of the multi-turn inductor. A terminal 224 is also designated at a location of a via 226 for pinning out the terminal 224 to another conductive line referred to as a trace 228.

The plurality of conductive lines 202 may alternatively be arranged as increasingly smaller spirals or coils, rather than squares. In one embodiment, the width of the first and second conductive lines 202A and 202B is greater than 2 μm, and may range from 2 to 100 μm. In another embodiment the width may be greater than 75 μm. The conductive structure 200 may be utilized in any suitable IC structure, such as a die, a package substrate, an interposer, a circuit board, etc. In one embodiment, the conductive lines 202 comprise a metal material. For example, the metal material may be selected from a group comprising copper, cobalt and tungsten. In the embodiment where the conductive lines 202 comprise copper, the air gaps 206 may also include a copper liner 209 along sidewalls of the air gaps 206. In one embodiment, the depth of the first and second conductive lines 202A and 202B is greater than 2 μm, and more specifically, approximately 2 to 6 μm. In the example embodiment shown, the depth of the first and second conductive lines 202A and 202B is approximately 4 μm. The ILD 204 may comprise silicon oxide or a carbon-doped silicon oxide film.

According to one or more embodiments, an air gap 206A is formed in the ILD 204 between the first and second conductive lines 202A and 202B, where the air gap 206A extends across the ILD 204 to opposing sidewalls of the first and second conductive lines 202A and 202B. In one embodiment, the width of the air gap 206A is equal to the distance between the first and second conductive lines 202A and 202B. In one embodiment, the width of the air gap and the distance between the first and second conductive lines 202A and 202B is greater than 1 μm, and more specifically, approximately 1 to 10 μm. Another air gap 206B is shown between two other conductive lines on the opposite side of the multi-turn inductor. Air gaps 206A and 206B may collectively be referred to as air gaps 206 and the first and second conductive lines 202A and 202B may be collectively referred to as conductive lines 202.

As shown in FIG. 2A, in one embodiment, a dielectric layer 210 is conformally formed over the top surface of the conductive structure 200, including the ILD 204, the conductive lines 202 and the air gaps 206.

According to one or more embodiments, each of the air gaps 206 includes one or more spacers, which may comprise a single spacer, but in an example embodiment, includes left and right spacers 208A and 208B (collectively referred to as one or more spacers 208). The one or more spacers 208 are located along at least a top corner of the air gaps 206 and along at least one sidewall of the adjacent conductive lines 202. Because the top opening of the air gaps 206 is microns in width, the one or more spacers 208 are necessary to reduce the width of the top opening so that the top opening can be bridged when the dielectric layer 210 is deposited via chemical vapor deposition (CVD) or physical vapor deposition (PVD).

In the example embodiment, left and right spacers 208A and 208B are shown formed along the sidewalls of the first and second conductive lines 202A and 202B, respectively, and coplanar with a top surface of the first and second conductive lines 202A and 202B. In one embodiment, the total width of the one or more spacers 208 is greater than ½ the width of the air gap 206A. For example, if the air gap 206A is 1 µm, then the left and right spacers 208A and 208B may each have a width of 400 nm for a total of 800 nm. In another embodiment, the width of the one or more spacers 208 is defined to leave an opening in the air gap 206A of approximately 100-300 nm, and more specifically 200 nm.

In one embodiment, the air gaps 206 may be formed as a continuous recess between the conductive lines 202. However, in large structures, such as an inductor, the conductive lines 202 may have a length that requires structural support of the ILD 204. In this case, the air gaps 206 are formed as non-contiguous air gap segments 212 that are spaced apart by segments of ILD 204 therebetween to provide structural support to the sidewalls of the conductive lines 202. In one embodiment, the air gap segments 212 each have a length greater than or equal to 10 µm. In one embodiment, the air gap segments 212 may be approximately 10-100 µm in length. In addition, the air gap segments 212 may also include corner segments formed conformally in turns or corners between the first and second conductive lines 202A and 202B of the inductor, as shown.

Accordingly, the air gaps 206 reduce parasitic capacitance between the conductive lines 202, which allows for less restrictive design rules with respect to required spacing between the conductive lines 202.

Figure 3A:
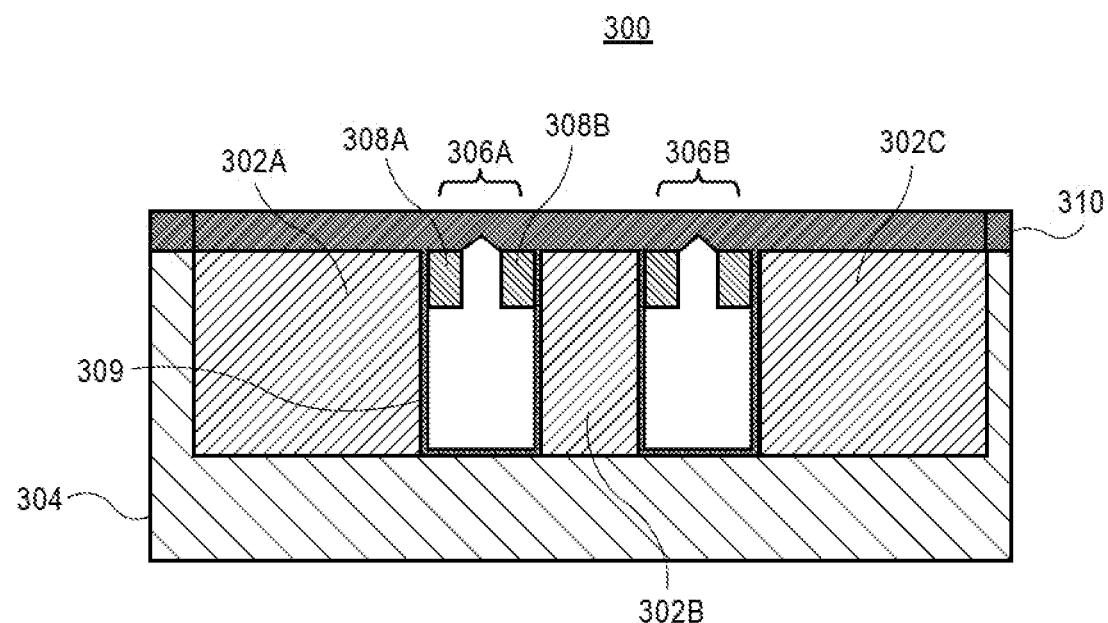
FIG. 3A is a side cross-sectional view (through the section line B-B of FIG. 3B) of a portion of an IC structure comprising a second conductive structure having adjacent conductive lines separated by air gaps.
Figure 3B:
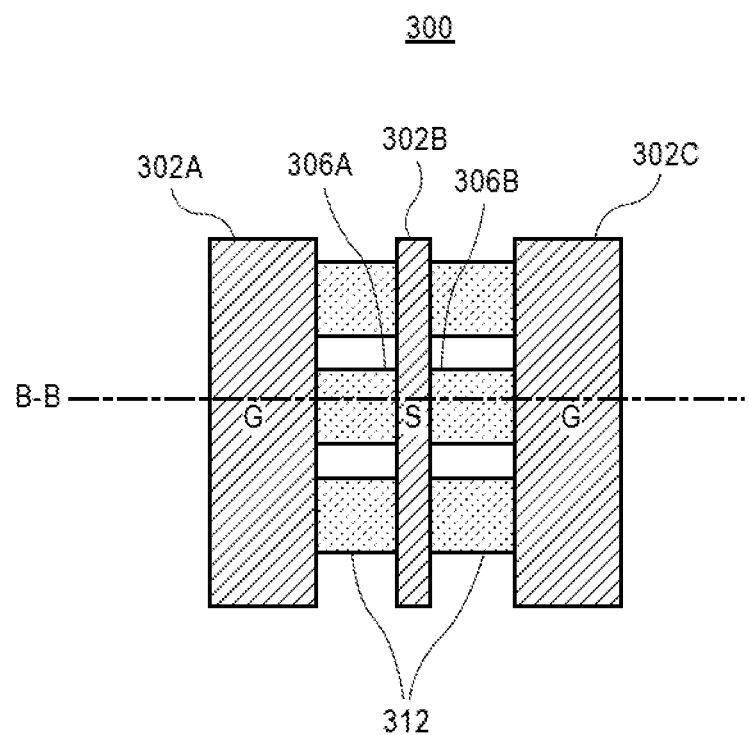
FIG. 3B is a plan view of the conductive structure showing an example embodiment where the second conductive structure comprises transmission lines.

FIG. 3A is a side cross-sectional view (through the section line B-B of FIG. 3B) of a portion of an IC structure comprising a conductive structure 300 having adjacent conductive lines separated by air gaps. FIG. 3B is a plan view of the conductive structure 300 showing an example embodiment where the conductive structure comprises transmission lines.

The conductive structure 300 comprises first, second and third conductive lines 302A, 302B and 302C (collectively referred to as conductive lines 302) along a same direction in an interlayer dielectric (ILD) 304. In this embodiment, the first, second and third conductive lines 302A, 302B and 302C are transmission lines, where the first and third conductive lines 302A and 302C are ground lines, and the second conductive line 302B is a signal line that lies between the first and third conductive lines 302A and 302C. In one embodiment, the width of the first and third conductive lines 302A and 302C of the conductive structure 300 is greater than 2 µm, and may range from 2 to 100 µm. In another embodiment the width may be greater than 75 µm. The conductive structure 300 may be utilized in any suitable IC structure, such as a die, a package substrate, an interposer, a circuit board, etc.

In one embodiment, the conductive lines 302 comprise a metal material. For example, the metal material may be selected from a group comprising copper, cobalt and tungsten. In the embodiment where the conductive lines 302 comprise copper, the air gaps 306 may also include a copper liner 309 along sidewalls of the air gaps 306. In one embodiment, the depth of the conductive lines 302 is greater than 2 µm, and more specifically, approximately 2 to 6 µm. In the example embodiment shown, the depth of the first and second conductive lines 202A and 202B is approximately 4 µm. The ILD 304 may comprise silicon oxide or a carbon-doped silicon oxide film.

According to one or more embodiments, a first air gap 306A is formed in the ILD 304 between the first and second conductive lines 302A and 302B, and a second air gap 306B is formed between the second and third conductive lines 302B and 302C. In both cases, the air gaps 306A and 306B (collectively referred to as air gaps 306) extend across the ILD 304 to opposing sidewalls of the two conductive lines 302 that the air gaps 306 lie between. In one embodiment, the adjacent conductive lines 302 are equidistance apart, and the width of the air gaps 306 is equal to the distance between the two adjacent conductive lines 302. In one embodiment, the width of the air gaps 306 and the distance between adjacent conductive lines 302 is greater than 1 µm, and more specifically, approximately 1 to 10 µm.

As shown in FIG. 3A, in one embodiment, a dielectric layer 310 is conformally formed over the top surface of the conductive structure 300, including the ILD 304, the conductive lines 302 and the air gaps 306.

According to one or more embodiments, each of the air gaps 306 includes one or more spacers, which may comprise a single spacer, but in an example embodiment, includes left and right spacers 308A and 308B (collectively referred to as one or more spacers 308). The one or more spacers 308 are located along at least a top corner of the air gaps 306 and along at least one sidewall of the adjacent conductive lines 302. In the example embodiment, left and right spacers 308A and 308B are shown formed along the sidewalls of the first and second conductive lines 302A and 302B, respectively, and coplanar with a top surface of the first and second conductive lines 302A and 302B. In one embodiment, the total width of the one or more spacers 308 is greater than ½ the width of the first air gap 306A. For example, if the first air gap 306A is 1 µm, then the left and right spacers 308A and 308B may each have a width of 400 nm for a total of 800 nm. In another embodiment, the width of the one or more spacers 308 is defined to leave an opening in the air gap 206A of approximately 100-300 nm, and more specifically 200 nm.

In one embodiment, the air gaps 306 may be formed as a continuous recess between the conductive lines 302. However, in large conductive structures, such as transmission lines, the air gaps 306 are formed as non-contiguous air gap segments 312 that are spaced apart by segments of ILD 304 therebetween to provide structural support to the sidewalls of the conductive lines 302. In one embodiment, the air gap segments 312 each have a length greater than or equal to 10 µm. In one embodiment, the air gap segments 312 may be approximately 10-100 µm in length.

In one embodiment, a process for fabricating both large conductive structures 200 and 300, which include adjacent conductive lines with an air gap in between may comprise forming one or more sets of first and second conductive lines along a same direction in an interlayer dielectric (ILD), where the first and second conductive lines have a width greater than 2 µm. The process further includes forming an air gap in the ILD between the first and second conductive lines, where the air gap extending across the ILD to sidewalls of the first and second conductive lines.

Figure 4A:
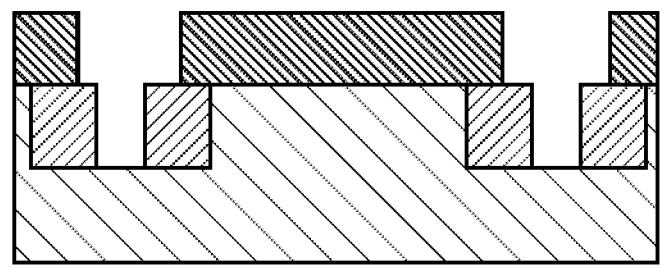
FIGS. 4A-4H illustrate cross-sectional views showing further details of a process for fabricating a large conductive structure comprising adjacent conductive lines with an air gap.
Figure 4B:
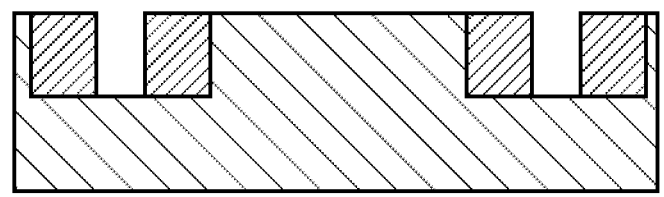
Figure 4C:
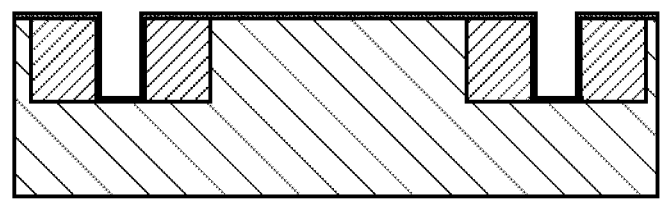
Figure 4D:
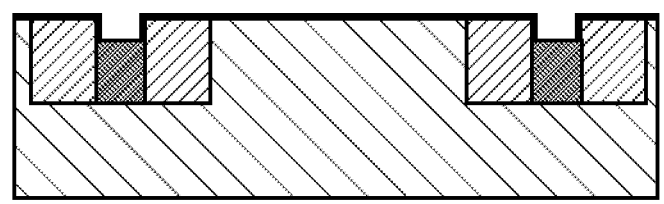
Figure 4E:
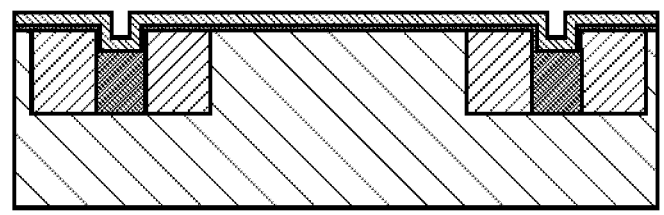
Figure 4F:
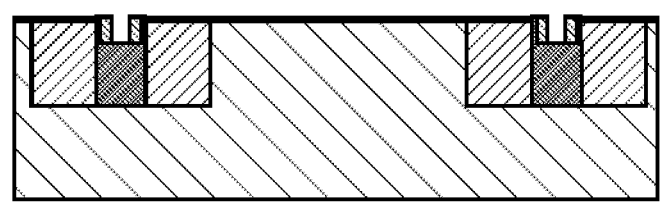

FIGS. 4A-4H illustrate cross-sectional views showing further details of a process for fabricating a large conductive structure comprising adjacent conductive lines with an air gap. FIG. 4A illustrates the fabrication process after conductive lines of a conductive structure have been formed in or on an ILD, and after a photoresist mask or hard mask has been formed with openings defining locations for air gaps between adjacent conductive lines. FIG. 4B illustrates the fabrication process after the ILD is etched under openings and the masks, and the mask removed to form air gaps in the ILD. FIG. 4C illustrates the fabrication process after an optional liner is conformally deposited over the ILD, the conductive lines, and the air gaps in the embodiment where the conductive lines comprise copper to limit diffusion of the copper into the ILD. FIG. 4D illustrates the fabrication process after a sacrificial material is deposited into the air gaps and after the sacrificial material has been recessed in the air gaps. In one embodiment, a carbon hardmask (CHM) may be used as a sacrificial material, or any type of sacrificial material may be used. In this embodiment, the sacrificial material is used as scaffold for depositing spacer material, as shown in FIGS. 4E and 4F.

Figure 4G:
Figure 4H:
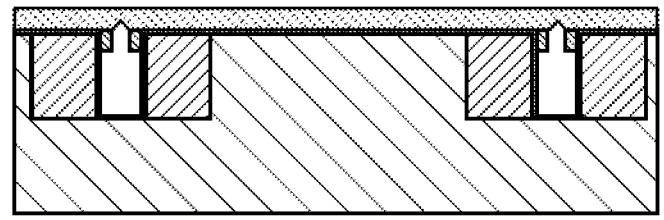

FIG. 4E illustrates the fabrication process after a spacer material is conformally deposited over the ILD, the conductive lines, and the sacrificial material. FIG. 4F illustrates the fabrication process after the spacer material has been etched to form spacers in the top corners of the air gaps and along sidewalls of adjacent conductive lines to decrease the width of the open-ends of the air gaps so that distance can be bridged by a traditional CVD deposition. FIG. 4G illustrates the fabrication process after the sacrificial material is removed from the air gaps using plasma ashing. FIG. 4H illustrates the fabrication process after a top dielectric layer is formed over the top surface of the conductive structure to seal the air gaps. In one embodiment, the top dielectric layer may be formed using chemical vapor deposition (CVD) or physical vapor deposition (PVD).

The integrated circuit structures described herein may be included in an electronic device. As an example of one such apparatus, FIGS. 5A and 5B are top views of a wafer and dies that include one or more large conductive structures having adjacent conductive lines separated by air gaps, in accordance with one or more of the embodiments disclosed herein.

Figure 5B:
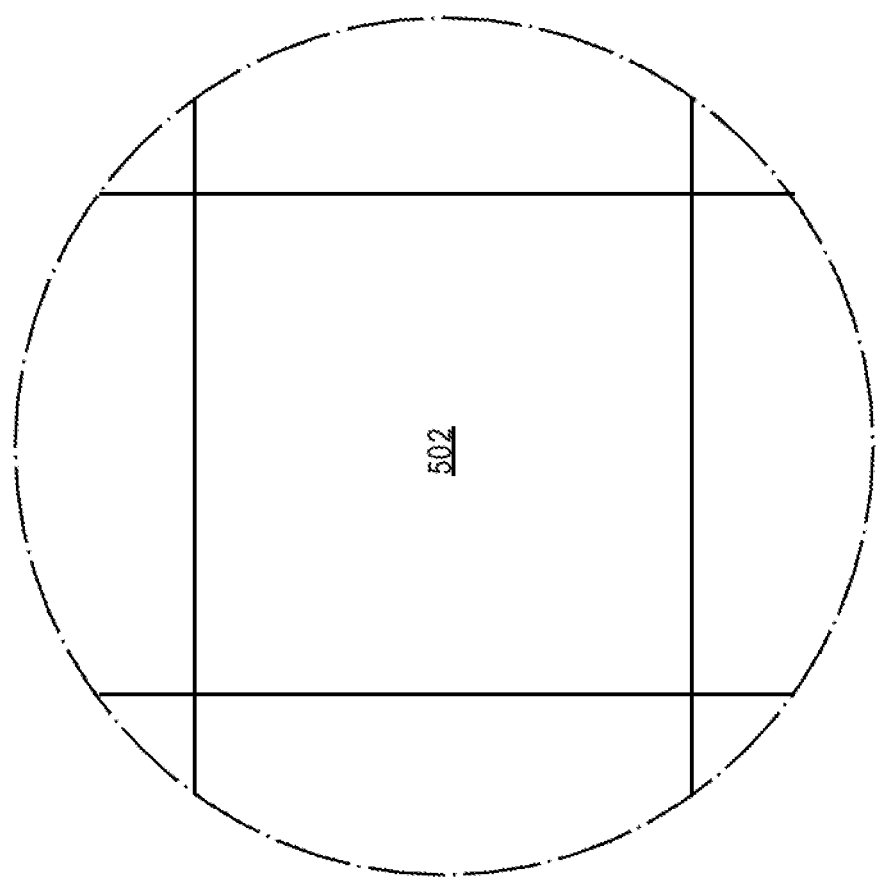
FIGS. 5A and 5B are top views of a wafer and dies that include one or more large conductive structures having adjacent conductive lines separated by air gaps, in accordance with one or more of the embodiments disclosed herein.
Figure 5A:
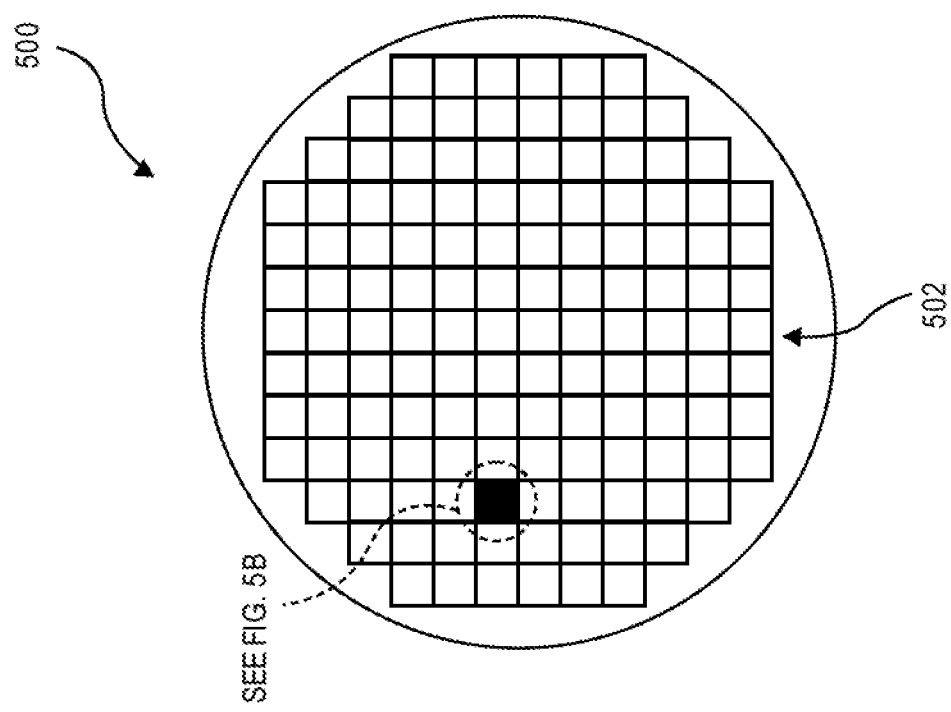

Referring to FIGS. 5A and 5B, a wafer 500 may be composed of semiconductor material and may include one or more dies 502 having integrated circuit (IC) structures formed on a surface of the wafer 500. Each of the dies 502 may be a repeating unit of a semiconductor product that includes any suitable IC (e.g., ICs including one or more large conductive structures having adjacent conductive lines separated by air gaps, such as described above. After the fabrication of the semiconductor product is complete, the wafer 500 may undergo a singulation process in which each of the dies 502 is separated from one another to provide discrete "chips" of the semiconductor product. In particular, large conductive structures having adjacent conductive lines separated by air gaps as disclosed herein may take the form of the wafer 500 (e.g., not singulated) or the form of the die 502 (e.g., singulated). The die 502 may include one or more large conductive structures having adjacent conductive lines separated by air gaps and/or supporting circuitry to route electrical signals, as well as any other IC components. In some embodiments, the wafer 500 or the die 502 may include an additional memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
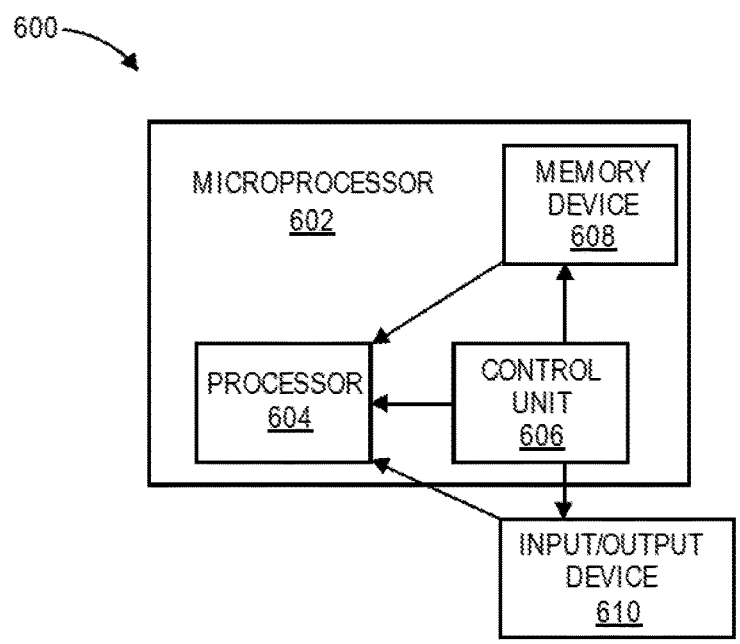
FIG. 6 illustrates a block diagram of an electronic system, in accordance with an embodiment of the present disclosure.

FIG. 6 illustrates a block diagram of an electronic system 600, in accordance with an embodiment of the present disclosure. The electronic system 600 can correspond to, for example, a portable system, a computer system, a process control system, or any other system that utilizes a processor and an associated memory. The electronic system 600 may include a microprocessor 602 (having a processor 604 and control unit 606), a memory device 608, and an input/output device 610 (it is to be appreciated that the electronic system 600 may have a plurality of processors, control units, memory device units and/or input/output devices in various embodiments). In one embodiment, the electronic system 600 has a set of instructions that define operations which are to be performed on data by the processor 604, as well as, other transactions between the processor 604, the memory device 608, and the input/output device 610. The control unit 606 coordinates the operations of the processor 604, the memory device 608 and the input/output device 610 by cycling through a set of operations that cause instructions to be retrieved from the memory device 608 and executed. The memory device 608 can include large conductive structures having adjacent conductive lines separated by air gaps as described in the present description. In an embodiment, the memory device 608 is embedded in the microprocessor 602, as depicted in FIG. 6. In an embodiment, the processor 604, or another component of electronic system 600, includes one or more large conductive structures having adjacent conductive lines separated by air gaps, such as those described herein.

Figure 7:
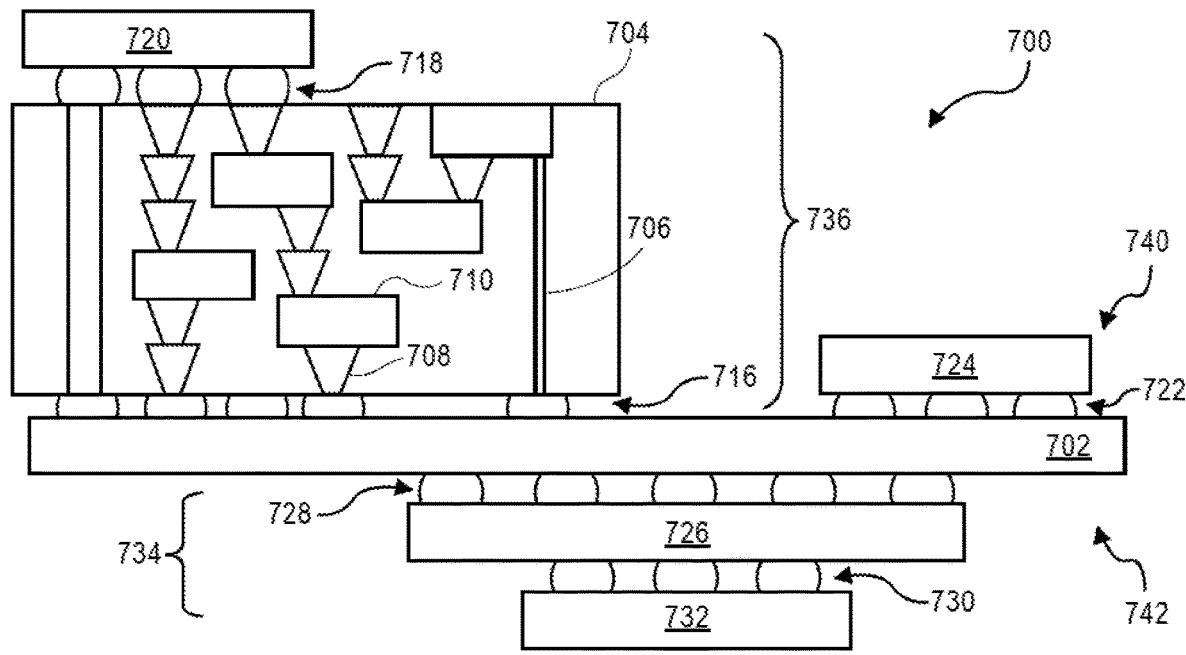
FIG. 7 is a cross-sectional side view of an integrated circuit (IC) device assembly that may include one or more large conductive structures having adjacent conductive lines separated by air gaps, in accordance with one or more of the embodiments disclosed herein.

FIG. 7 is a cross-sectional side view of an integrated circuit (IC) device assembly that may include one or more large conductive structures having adjacent conductive lines separated by air gaps, in accordance with one or more of the embodiments disclosed herein.

Referring to FIG. 7, an IC device assembly 700 includes components having one or more integrated circuit structures described herein. The IC device assembly 700 includes a number of components disposed on a circuit board 702 (which may be, e.g., a motherboard). The IC device assembly 700 includes components disposed on a first face 740 of the circuit board 702 and an opposing second face 742 of the circuit board 702. Generally, components may be disposed on one or both faces 740 and 742. In particular, any suitable ones of the components of the IC device assembly 700 may include a number of large conductive structures having adjacent conductive lines separated by air gaps, such as disclosed herein.

In some embodiments, the circuit board 702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate.

The IC device assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), male and female portions of a socket, an adhesive, an underfill material, and/or any other suitable electrical and/or mechanical coupling structure.

The package-on-interposer structure 736 may include an IC package 720 coupled to an interposer 704 by coupling components 718. The coupling components 718 may take any suitable form for the application, such as the forms discussed above with reference to the coupling components 716. Although a single IC package 720 is shown in FIG. 7, multiple IC packages may be coupled to the interposer 704. It is to be appreciated that additional interposers may be coupled to the interposer 704. The interposer 704 may provide an intervening substrate used to bridge the circuit board 702 and the IC package 720. The IC package 720 may be or include, for example, a die (the die 502 of FIG. 5B), or any other suitable component. Generally, the interposer 704 may spread a connection to a wider pitch or reroute a connection to a different connection. For example, the interposer 704 may couple the IC package 720 (e.g., a die) to a ball grid array (BGA) of the coupling components 716 for coupling to the circuit board 702. In the embodiment illustrated in FIG. 7, the IC package 720 and the circuit board 702 are attached to opposing sides of the interposer 704. In other embodiments, the IC package 720 and the circuit board 702 may be attached to a same side of the interposer 704. In some embodiments, three or more components may be interconnected by way of the interposer 704.

The interposer 704 may be formed of an epoxy resin, a fiberglass-reinforced epoxy resin, a ceramic material, or a polymer material such as polyimide. In some implementations, the interposer 704 may be formed of alternate rigid or flexible materials that may include the same materials described above for use in a semiconductor substrate, such as silicon, germanium, and other group III-V and group IV materials. The interposer 704 may include metal interconnects 710 and vias 708, including but not limited to through-silicon vias (TSVs) 706. The interposer 704 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The IC device assembly 700 may include an IC package 724 coupled to the first face 740 of the circuit board 702 by coupling components 722. The coupling components 722 may take the form of any of the embodiments discussed above with reference to the coupling components 716, and the IC package 724 may take the form of any of the embodiments discussed above with reference to the IC package 720.

Figure 8:
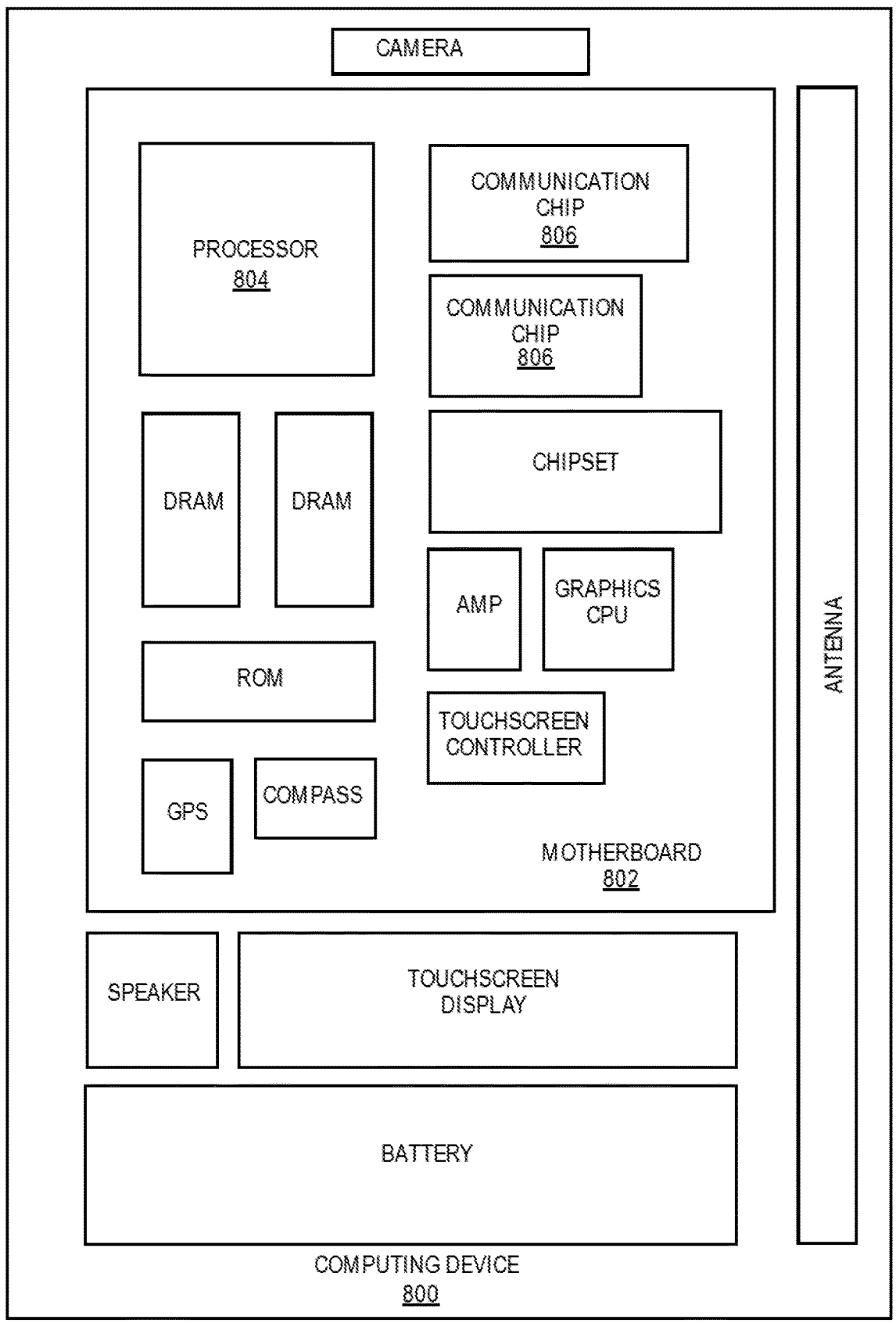
FIG. 8 illustrates a computing device 800 in accordance with one implementation of the disclosure.

The IC device assembly 700 illustrated in FIG. 8 includes a package-on-package structure 734 coupled to the second face 742 of the circuit board 702 by coupling components 728. The package-on-package structure 734 may include an IC package 726 and an IC package 732 coupled together by coupling components 730 such that the IC package 726 is disposed between the circuit board 702 and the IC package 732. The coupling components 728 and 730 may take the form of any of the embodiments of the coupling components 716 discussed above, and the IC packages 726 and 732 may take the form of any of the embodiments of the IC package 720 discussed above. The package-on-package structure 734 may be configured in accordance with any of the package-on-package structures known in the art.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more large conductive structures having adjacent conductive lines separated by air gaps, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more large conductive structures having adjacent conductive lines separated by air gaps, in accordance with implementations of embodiments of the disclosure.

In further implementations, another component housed within the computing device 800 may contain an integrated circuit die that includes one or more large conductive structures having adjacent conductive lines separated by air gaps, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Thus, embodiments described herein include embedded large conductive structures having adjacent conductive lines separated by air gaps.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

An integrated circuit structure comprises one or more sets of first and second conductive lines along a same direction in an interlayer dielectric (ILD), the first and second conductive lines having a width greater than 2 µm. An air gap is in the ILD between the first and second conductive lines, the air gap extending across the ILD to sidewalls of the first and second conductive lines.

Example Embodiment 2

The integrated circuit structure of example embodiment 1, wherein the width of the air gap and the distance between the first and second conductive lines is approximately 1 to 10 µm.

Example Embodiment 3

The integrated circuit structure of embodiment 1 to 2, wherein the air gap includes one or more spacers along at least one top corner of the air gap and at least one sidewall of the first and second conductive lines.

Example Embodiment 4

The integrated circuit structure of embodiment 2 or 3 wherein the one or more spacers leave an opening in the air gap of approximately 100-300 nm.

Example Embodiment 5

The integrated circuit structure of embodiment 2 or 3, wherein the air gap includes left and right spacers formed along the sidewalls of the first and second conductive lines, respectively, where the left and right spacers are coplanar with a top surface of the first and second conductive lines.

Example Embodiment 6

The integrated circuit structure of embodiment 1, 2, 3, 4 or 5, wherein the air gap is formed as a continuous recess between the first and second conductive lines.

Example Embodiment 7

The integrated circuit structure of embodiment 1, 2, 3, 4 or 5, wherein the air gap is formed as non-contiguous air gap segments that are spaced apart by the ILD to provide structural support to the sidewalls of the first and second conductive lines.

Example Embodiment 8

The integrated circuit structure of embodiment 7, wherein the non-contiguous air gap segments are greater than 10 µm in length.

Example Embodiment 9

The integrated circuit structure of embodiment 1, 2, 3, 4, 5, 6, 7 or 8, further comprising a dielectric layer conformally formed over the ILD, a top surface of the first and second conductive lines, and the top of the air gap.

Example Embodiment 10

The integrated circuit structure of embodiment 1, 2, 3, 4, 5, 6, 7, 8 or 9 wherein the first and second conductive lines have a depth greater than 2 to 6 µm.

Example Embodiment 11

The integrated circuit structure of embodiment 1, 2, 3, 4, 5, 6, 7, 8, 9 or 10, wherein the first and second conductive lines have a depth of approximately 2 to Example embodiment 12: The integrated circuit structure of embodiment 1, 2, 3, 4, 5, 6, 7, 8, 9, 10 or 11, wherein the first and second conductive lines comprise parts of a multi-turn inductor.

Example Embodiment 13

The integrated circuit structure of embodiment 12, wherein the first conductive line is in an outer turn of the multi-turn inductor and the second conductive line is in an inner turn of the multi-turn inductor.

Example Embodiment 14

The integrated circuit structure of embodiment 1, 2, 3, 4, 5, 6, 7, 8, 9, 10, 11, or 12, wherein the first and second conductive lines comprise transmission lines.

Example Embodiment 15

A method of fabricating a conductive structure, comprises forming one or more sets of first and second conductive lines along a same direction in an interlayer dielectric (ILD), the first and second conductive lines having a width greater than 2 µm. An air gap is formed in the ILD between the first and second conductive lines, the air gap extending across the ILD to sidewalls of the first and second conductive lines.

Example Embodiment 16

The method of embodiment 15, further comprising: forming the air gap and the distance between the first and second conductive lines to have a width of approximately 1 to 10 µm.

Example Embodiment 17

The method of embodiment 15 or 16, further comprising: forming the air gap to include one or more spacers along at least one top corner of the air gap and at least one sidewall of the first and second conductive lines.

Example Embodiment 18

The method of embodiment 17, further comprising: forming the one or more spacers such that each of the spacers comprises left and right spacers formed along the sidewalls of the first and second conductive lines, respectively, where the left and right spacers are coplanar with a top surface of the first and second conductive lines.

Example Embodiment 19

The method of embodiment 15, 16, 17 or 18, further comprising: forming the air gap as non-contiguous air gap segments that are spaced apart by the ILD to provide structural support to the sidewalls of the first and second conductive lines.

Example Embodiment 20

The method of embodiment 19, further comprising: forming the non-contiguous air gap segments have a length greater than 10 µm.

Example Embodiment 21

A method of fabricating a conductive structure, comprises forming conductive lines in or on an ILD, and forming a mask with openings defining locations for air gaps between adjacent conductive lines. The ILD is etched under the openings in the mask and the mask to is removed to form the air gaps in the ILD. A sacrificial material is deposited into the air gaps and recessing the sacrificial material in the air gaps. A spacer material is conformally deposited over the ILD, the conductive lines, and the sacrificial material. The spacer material is etched to form one or more spacers in top corners of the air gaps and along sidewalls of adjacent ones of the conductive lines to decrease a width of open-ends of the air gaps. The sacrificial material is removed from the air gaps. A top dielectric layer is formed over a top surface of the conductive structure to seal the air gaps.

Example Embodiment 22

The method of embodiment 21, further comprising: conformally depositing a liner over the ILD prior to depositing the sacrificial material.

Example Embodiment 23

The method of embodiment 21 or 22, further comprising: forming the air gaps such that a width of the air gaps and a distance between the adjacent ones of the conductive lines is approximately 1 to 10 µm.

Example Embodiment 24

The method of embodiment 21, 22 or 23, further comprising: forming the one or more spacers to leave an opening in the air gap of approximately 100-300 nm.

Example Embodiment 25

The method of embodiment 21, 22, 23 or 24, further comprising: forming the one or more spacers as non-contiguous air gap segments that are spaced apart by the ILD to provide structural support to the sidewalls of the adjacent ones of the conductive lines.

What is claimed is:

1. A multi-turn inductor, comprising:
   one or more sets of first and second conductive lines along a same direction in an interlayer dielectric (ILD), the first and second conductive lines having a width greater than 2 µm;
   an air gap in the ILD between the first and second conductive lines, the air gap extending across the ILD to sidewalls of the first and second conductive lines; and
   one or more spacers along at least one top corner of the air gap and at least one sidewall of the first and second conductive lines, where the one or more spacers are coplanar with a top surface of the first and second conductive lines, and have a depth less than half a depth of the first and second conductive lines.

2. The multi-turn inductor of claim 1, wherein the width of the air gap and a distance between the first and second conductive lines is approximately 1 to 10 µm.

3. The multi-turn inductor of claim 1, wherein the one or more spacers leave an opening in the air gap of approximately 100-300 nm.

4. The multi-turn inductor of claim 1, wherein the air gap includes left and right spacers formed along the sidewalls of the first and second conductive lines, respectively.

5. The multi-turn inductor of claim 1, wherein the air gap is formed as a continuous recess between the first and second conductive lines.

6. The multi-turn inductor of claim 1, wherein the air gap is formed as non-contiguous air gap segments that are spaced apart by the ILD to provide structural support to the sidewalls of the first and second conductive lines.

7. The multi-turn inductor of claim 6, wherein the non-contiguous air gap segments are greater than 10 μm in length.

8. The multi-turn inductor of claim 1, further comprising a dielectric layer conformally formed over the ILD, a top surface of the first and second conductive lines, and the top of the air gap.

9. The multi-turn inductor of claim 1, wherein the first and second conductive lines have a depth greater than 2 μm.

10. The multi-turn inductor of claim 1, wherein the first and second conductive lines have a depth of approximately 2 to 6 μm.

11. The multi-turn inductor of claim 1, wherein the first conductive line is in an outer turn of the multi-turn inductor and the second conductive line is in an inner turn of the multi-turn inductor.

12. The multi-turn inductor of claim 1, wherein the first and second conductive lines comprise transmission lines.

\* \* \* \* \*